(12) United States Patent
Brandt et al.

(10) Patent No.: US 7,697,300 B2
(45) Date of Patent: Apr. 13, 2010

(54) ELECTRONIC UNIT AND METHOD FOR MANUFACTURING AN ELECTRONIC UNIT

(75) Inventors: Jens Brandt, Bad Abbach (DE); Nikolaus Kerner, Wenzenbach (DE)

(73) Assignee: Siemens Aktiengesellschaft, Munich (DE)

( * ) Notice: Subject to any disclaimer, the term of this patent is extended or adjusted under 35 U.S.C. 154(b) by 349 days.

(21) Appl. No.: 10/566,698

(22) PCT Filed: Jul. 28, 2004

(86) PCT No.: PCT/EP2004/051634

§ 371 (c)(1),
(2), (4) Date: May 30, 2006

(87) PCT Pub. No.: WO2005/012042

PCT Pub. Date: Feb. 10, 2005

(65) Prior Publication Data

US 2008/0144290 A1    Jun. 19, 2008

(30) Foreign Application Priority Data

Aug. 1, 2003  (DE)  ................ 103 35 338

(51) Int. Cl.
*H05K 7/20* (2006.01)
*H05K 3/20* (2006.01)

(52) U.S. Cl. .............. 361/736; 361/704; 361/705; 361/720; 361/728; 361/737

(58) Field of Classification Search .............. 361/704, 361/705, 728, 736, 737, 720
See application file for complete search history.

(56) References Cited

U.S. PATENT DOCUMENTS

| | | | | |
|---|---|---|---|---|
| 3,951,490 A | * | 4/1976 | Devendorf | 439/63 |
| 4,409,641 A | * | 10/1983 | Jakob et al. | 361/720 |
| 4,532,952 A | * | 8/1985 | Norwood | 137/240 |
| 4,587,593 A | * | 5/1986 | Liautaud et al. | 361/690 |
| 4,594,644 A | * | 6/1986 | Painter | 361/807 |
| 4,791,531 A | * | 12/1988 | Jessup | 361/736 |
| 5,079,672 A | | 1/1992 | Haubner et al. | |
| 5,099,396 A | | 3/1992 | Barz et al. | |

(Continued)

FOREIGN PATENT DOCUMENTS

DE  195 28 632 A1  2/1997

(Continued)

OTHER PUBLICATIONS

Handbuch der Leiterplattentechnik, Band 2: Neue Verfahren, Neue Technologien (Buck, et al.), pp. 191-194 and 259-260, 1991.

*Primary Examiner*—Anatoly Vortman
(74) *Attorney, Agent, or Firm*—Laurence A. Greenberg; Werner H. Stemer; Ralph H. Locher

(57) ABSTRACT

An electronic unit, in particular a control device for a motor vehicle, has a printed circuit board, populated with electronic components, and a housing enclosing the printed circuit board. The printed circuit board has at least one first section, arranged at a distance from the housing and equipped with electronic components on both sides thereof, and at least one second section which is connected to the housing by way of a heat-conducting adhesive layer.

14 Claims, 3 Drawing Sheets

U.S. PATENT DOCUMENTS

| | | | |
|---|---|---|---|
| 5,392,197 A * | 2/1995 | Cuntz et al. | 361/818 |
| 5,414,597 A * | 5/1995 | Lindland et al. | 361/816 |
| 5,430,618 A * | 7/1995 | Huang | 361/818 |
| 5,434,747 A * | 7/1995 | Shibata | 361/753 |
| 5,659,459 A * | 8/1997 | Wakabayashi et al. | 361/753 |
| 5,699,235 A * | 12/1997 | Tsurumiya et al. | 361/803 |
| 6,034,876 A * | 3/2000 | Ohno et al. | 361/752 |
| 6,084,776 A | 7/2000 | Cuntz et al. | |
| 6,125,041 A * | 9/2000 | Yoshikawa et al. | 361/737 |
| 6,128,194 A * | 10/2000 | Francis | 361/737 |
| 6,185,100 B1 * | 2/2001 | Bentz et al. | 361/704 |
| 6,222,733 B1 | 4/2001 | Gammenthaler | |
| 6,233,153 B1 * | 5/2001 | Baur et al. | 361/752 |
| 6,407,925 B1 * | 6/2002 | Kobayashi et al. | 361/752 |
| 6,466,447 B2 * | 10/2002 | Murowaki et al. | 361/752 |
| 6,867,968 B2 | 3/2005 | Katsuro et al. | |
| 2001/0017215 A1 * | 8/2001 | Kimura et al. | 174/52.1 |
| 2001/0017766 A1 * | 8/2001 | Murowaki et al. | 361/752 |
| 2002/0112870 A1 | 8/2002 | Kobayashi et al. | |
| 2002/0149916 A1 * | 10/2002 | Kurle et al. | 361/752 |
| 2002/0154466 A1 * | 10/2002 | Morino et al. | 361/211 |
| 2002/0186551 A1 * | 12/2002 | Murowaki et al. | 361/752 |
| 2003/0035278 A1 * | 2/2003 | Lawlyes et al. | 361/796 |
| 2003/0117776 A1 | 6/2003 | Katsuro et al. | |
| 2003/0133267 A1 * | 7/2003 | Beihoff et al. | 361/704 |
| 2003/0206392 A1 * | 11/2003 | Kawata | 361/631 |
| 2004/0141292 A1 * | 7/2004 | Onizuka et al. | 361/704 |
| 2004/0223304 A1 * | 11/2004 | Kobayashi et al. | 361/715 |
| 2005/0047095 A1 * | 3/2005 | Tomikawa et al. | 361/715 |

FOREIGN PATENT DOCUMENTS

| | | |
|---|---|---|
| DE | 195 41 925 A1 | 5/1997 |
| DE | 196 00 619 A1 | 7/1997 |
| DE | 197 01 731 A1 | 7/1998 |
| EP | 0 540 071 A1 | 5/1993 |
| EP | 0 854 666 B1 | 11/2003 |
| JP | 9139243 A | 5/1997 |
| JP | 2001288333 A | 10/2001 |
| JP | 2002190556 A | 7/2002 |
| JP | 2003198165 A | 7/2003 |

* cited by examiner

ELECTRONIC UNIT AND METHOD FOR MANUFACTURING AN ELECTRONIC UNIT

BACKGROUND OF THE INVENTION

Field of the Invention

The present invention relates to an electronic unit, in particular a control device for a motor vehicle, comprising at least one printed circuit board which is populated with electronic components and a housing that encloses the printed circuit board. Furthermore, the invention relates to a method for manufacturing such an electronic unit and to a use of such an electronic unit.

In the field of motor vehicle electronics, control devices for controlling electrical and electronic vehicle components (e.g. engine control devices) are well known, the circuit board (circuit carrier) being manufactured by means of thick-film technology or laminate technology in order to achieve greater temperature stability.

In the case of thick-film technology, provision is made for a relatively thick ceramic substrate with likewise relatively thick fired-on conductor paths, for example. This has clear cost disadvantages, since the manufacturing of such a printed circuit board is significantly more expensive than the manufacturing of a simple printed circuit board (e.g. comprising a thin epoxy substrate).

In the case of laminate technology, a conventional printed circuit board is combined with a metal layer to form a laminate by applying a high pressure and a high temperature, for example. This is disadvantageous in that the printed circuit board which is manufactured using laminate technology can only be populated with electronic components on one side, and therefore the surface requirement in a predetermined electronic circuit arrangement is greater in comparison with conventional printed circuit boards which are populated on both sides. Avoiding the increased surface requirement by arranging two or more printed circuit boards one above the other, for example, is often unsatisfactory since the construction space and the assembly costs are increased in this case.

In general, it is important in many application scenarios to implement an efficient heat dissipation from the electronic components to the housing, in particular if e.g. active semiconductor power components are used in the electronic unit and/or the electronic unit will be used in an environment featuring comparatively high ambient temperature. This applies in the case of control devices for vehicles, for example, which control devices are arranged in the vicinity of or directly at an internal combustion engine, e.g. in order to simplify the wire harness configuration of the vehicle or in order to allow the engine to be electronically tested together with the associated control device in a simple manner. The above cited thick-film technology or laminate technology are usually used for the known control devices which are installed close to the engine.

SUMMARY OF THE INVENTION

The invention addresses the problem of improving an electronic unit of the type cited at the beginning in respect of heat dissipation properties and in respect of manufacturing costs.

This problem is solved by an electronic unit as claimed in claim 1 and a method for manufacturing an electronic unit as claimed in claim 11. The dependent claims relate to advantageous developments of the invention.

The electronic unit according to the invention includes at least one printed circuit board section which is arranged at a distance from the housing and is populated on both sides with electronic components. This or these printed circuit board sections are subsequently designated as "first printed circuit board section(s)". The printed circuit board also includes at least one printed circuit board section which is connected to the housing via a heat-conducting adhesive layer. This or these printed circuit board sections are subsequently designated as "second printed circuit board section(s)". In the case of a multipart housing, this bonding to the second printed circuit board section or sections can occur at any of the housing parts. As a result of the partially two-sided component mounting (on the first printed circuit board section, of which there is at least one), there is a comparatively smaller surface requirement, particularly if the portion of the first printed circuit board section or sections represents at least 30% of the total printed circuit board surface. Furthermore, the second printed circuit board section advantageously acts as both a mechanical and thermal "interface" to the housing, which should be considered in this regard as both a mechanical base and a heat sink. According to the invention, the connection via an adhesive layer makes the design of this dual-purpose interface very efficient, favorable in terms of manufacturing, and economical in terms of space.

For the sake of simplicity, reference is only made to the first printed circuit board section or second printed circuit board section in the following, even though a plurality of such sections can be provided in each case. The explanations which are provided for such a printed circuit board section can then readily be applied to more than one or all of the relevant plurality of printed circuit board sections.

That side of the second printed circuit board section to which the adhesive layer is applied is preferably provided with a metal surface (extended conductor path), in order to achieve horizontal heat spreading and good thermal connection to the adjoining adhesive layer. That side of a second printed circuit board section which is opposite to the adhesive layer is highly suitable for fitting with electronic components which produce particularly large amounts of heat, since this heat can be transferred via the nearby underlying adhesive layer which has little heat transmission resistance, in particular via heat-conducting metallized through openings ("vias") which are arranged at this position.

The adhesive is preferably applied as liquid adhesive and then cured. The curing of the adhesive can easily be performed thermally. For good heat dissipation efficiency, the use of an adhesive having a thermal conductivity of at least 0.5 W/mK, in particular at least 1 W/mK, is preferred.

The adhesive layer connection between the printed circuit board and the housing makes it possible to dispense with the screw connection which is usually provided in conventional electronic units for the purpose of fastening. If the electronic unit has a plurality of printed circuit boards which are stacked in parallel with each other, the further printed circuit boards can likewise be fastened inside the housing by means of bonding and/or conventional screw connection, e.g. using suitable spacers.

In an embodiment, the housing comprises a housing floor and a housing cover which is connected thereto. This has the advantage that the manufacturing of the electronic unit can be done in a simple manner by initially gluing the already populated printed circuit board into place in one of these housing parts and then closing the housing by connecting between housing floor and housing cover. For good heat dissipation through the housing, it is advantageous if the entire housing or at least that part of the housing which is thermally connected to the printed circuit board via the adhesive layer is made of a material offering good thermal conductivity such as, for example, metal (e.g. aluminum alloy).

In a preferred embodiment, the housing floor includes cross-sectional indentations for providing housing internal sections that are used for connecting to the second printed circuit board section via the adhesive layer, there being at least one such second printed circuit board section.

A connection between housing floor and housing cover, which connection is simple in terms of manufacturing, can be implemented by means of a glued groove-and-projection connection. In particular, the adhesive which is in any case required for the connection between printed circuit board and housing can be used for this purpose. The housing internal space can be effectively protected against contamination by means of a structure in which an annularly continuous projection running around the edge of a housing part (floor or cover) engages in a correspondingly arranged groove in the other housing part.

In particular, for a low construction height of the electronic unit, it is beneficial to integrate at least one electrical plug connector in the housing cover in order to provide an electrical connection possibility. According to the invention, terminal pins of the plug connector can run straight to the printed circuit board which is adjacent to the housing cover, and can be contacted directly onto this printed circuit board. In particular, in the case of this straight terminal pin alignment, the contacting can be provided easily in the form of press-in contacting, e.g. by placement of the housing cover which is equipped with the plug connector or connectors onto the housing floor when the housing is closed.

The specific arrangement of the second printed circuit board section or sections (considered in the plane of the printed circuit board) has a bearing on the fastening and the heat dissipation properties. In this context, it has proven beneficial if at least two second printed circuit board sections are provided, whose minimal reciprocal distance is greater than 40% of a maximal printed circuit board extent. This is primarily advantageous for stable storage of the printed circuit board which is mounted at the second printed circuit board sections. Irrespective of this, it is beneficial if at least one of the second printed circuit board sections is arranged at a printed circuit board edge. Finally, it is also beneficial in this respect if at least one of the second printed circuit board sections runs along a large part of a printed circuit board edge, and particularly in an annularly continuous manner along a printed circuit board edge. Such an annular connection of the printed circuit board to the housing holds the printed circuit board in a particularly stable manner and results in a particularly uniform heat dissipation during operation of the electronic unit.

Where the printed circuit board side which is opposite to the adhesive layer is not populated with electronic components in a first printed circuit board section, this location is suitable for arranging a conductor path surface which acts as a heat spreading surface and can efficiently dissipate the accumulated heat to the underlying adhesive layer.

A simple method for manufacturing the electronic unit can include, for example, the following steps:
- providing the already populated printed circuit board,
- providing a contoured housing floor having raised housing internal areas and having a groove which runs around the edge of the housing floor,
- depositing liquid adhesive to the raised housing floor areas and to the base of the groove,
- pressing on the printed circuit board in order to bond said printed circuit board onto the raised housing floor surfaces,
- providing a housing cover having a projection which is suitable for engaging in the housing floor groove, and
- pressing the housing cover onto the housing floor in order to create a glued groove-and-projection connection between housing floor and housing cover and in order to contact terminal pins of the plug connector arrangement via press-in technology.

The plug connector arrangement can be contacted to the printed circuit board, e.g. after the printed circuit board has been populated, by means of press-in technology before the printed circuit board is bonded. Alternatively, for example, it is possible for the plug-connector arrangement to be integrated in the housing cover and pressed on together with the housing cover.

The invention is described in greater detail below with reference to an exemplary embodiment and with reference to the attached drawings, in which:

DESCRIPTION OF THE PREFERRED EMBODIMENTS

Figure 1:
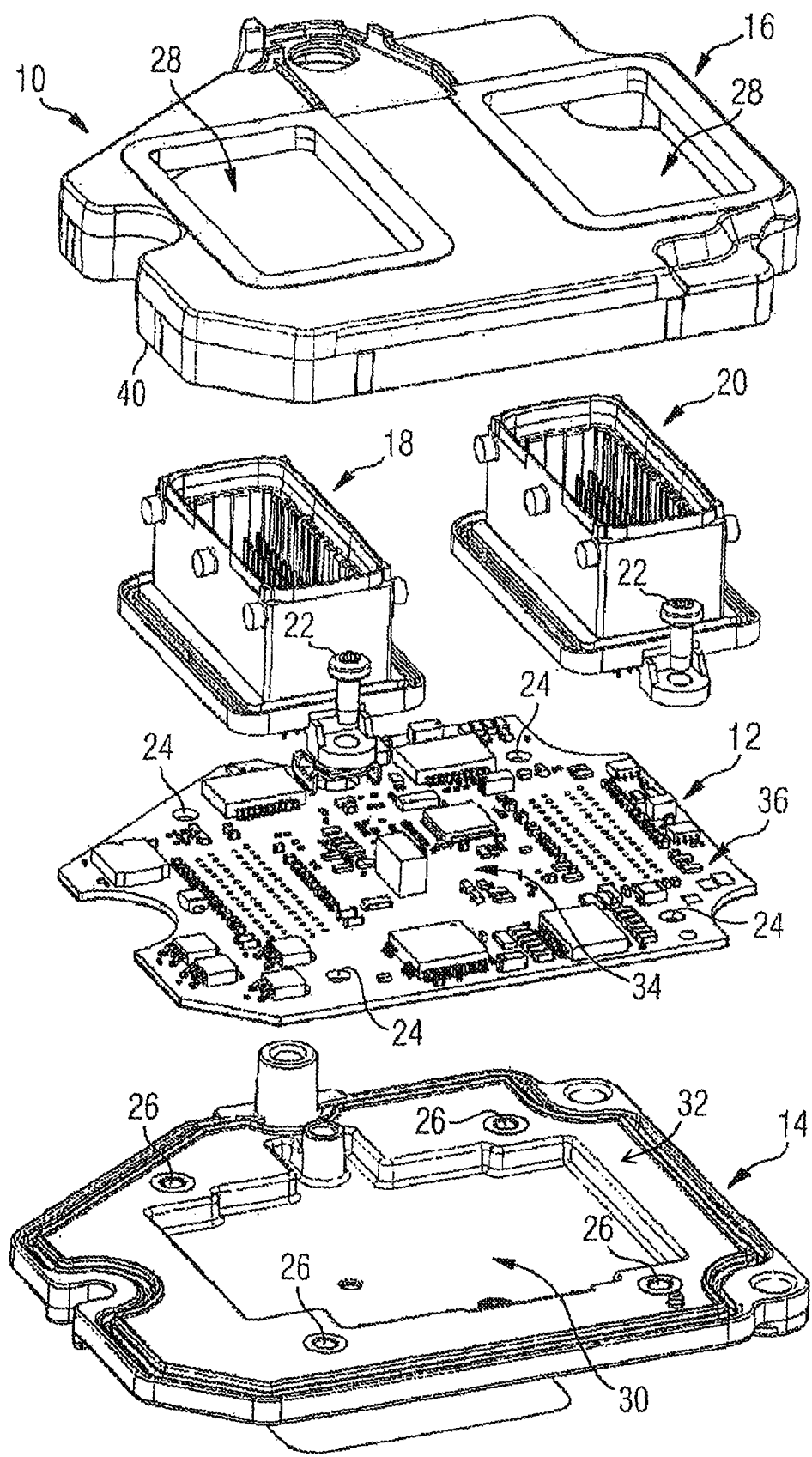
FIG. 1 shows an exploded view of a control device for a vehicle.
Figure 2:
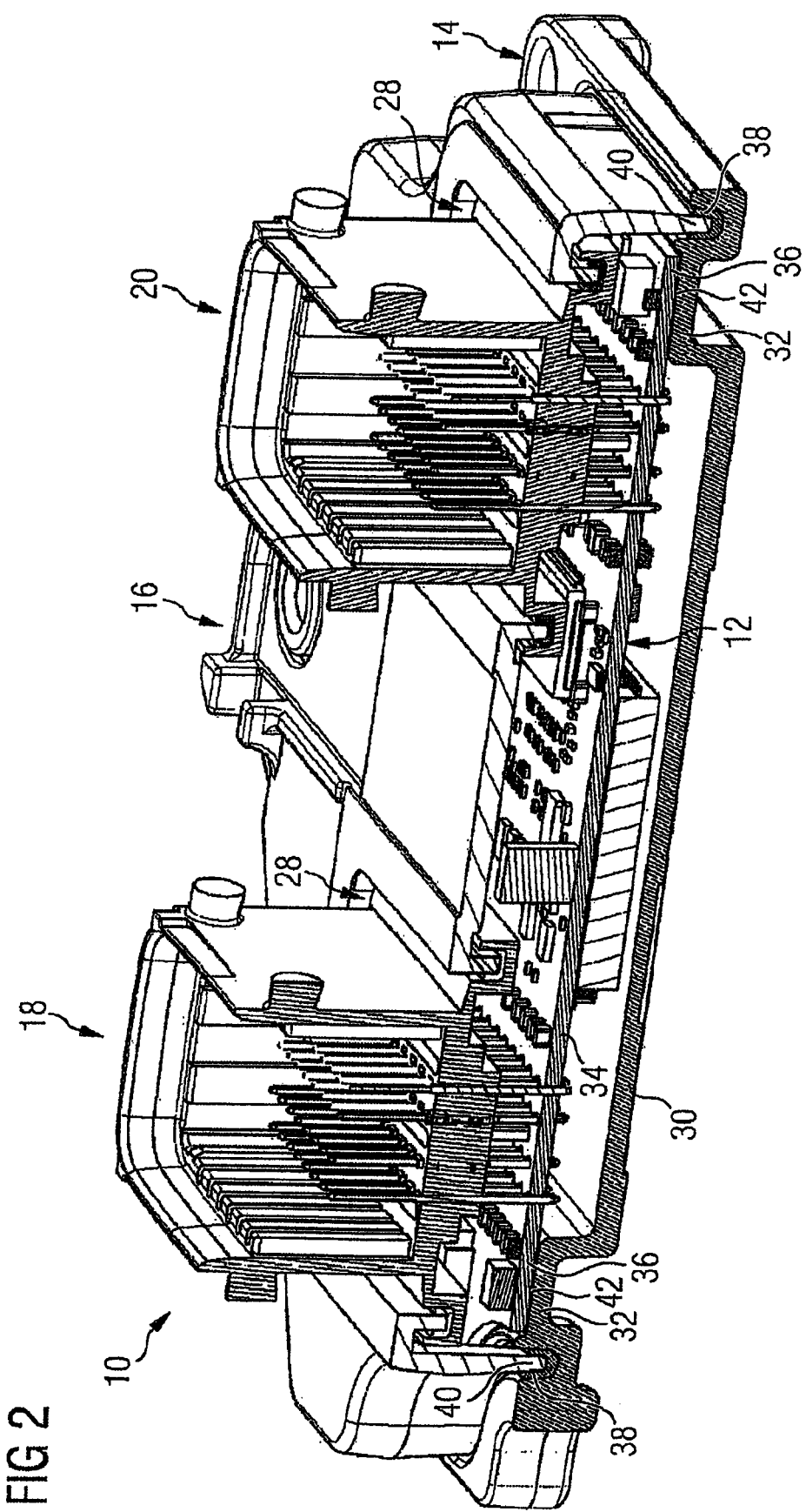
FIG. 2 shows a sectional view of the control device in the assembled state in longitudinal section.
Figure 3:
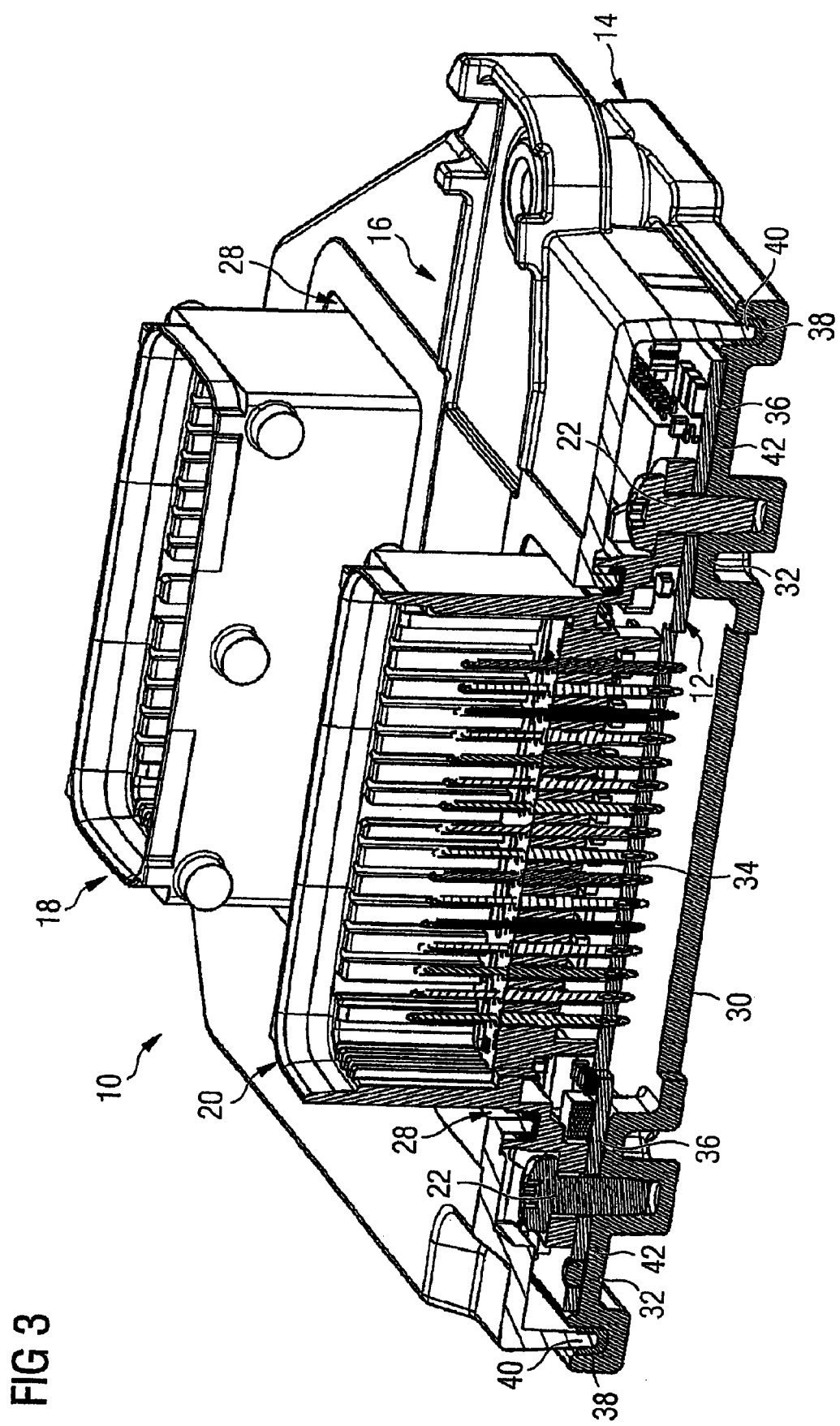
FIG. 3 shows a sectional view of the control device in the assembled state in cross section.

The FIGS. 1 to 3 show a control device for a vehicle, said control device having the overall designation of 10. The control device 10 is formed from a rigid printed circuit board 12 (e.g. epoxy substrate with copper conductor paths or surfaces), said printed circuit board being populated with electronic components, and a housing which encloses this printed circuit board, said housing being designed in two parts and comprising a housing floor 14 (base plate) and a housing cover 16. For the electrical connection of the control device to the vehicle electronics of the relevant motor vehicle (e.g. to a test device), provision is made for two plug connectors 18, 20 which, for the purpose of contacting, are placed on the upper side of the printed circuit board 12 in the illustrated exemplary embodiment by means of press-in technology during the assembly of the control device and are screwed to the housing floor 14. For this purpose, the plug-connector housings are provided with fastening screws 22 which, in the assembled state, pass through openings 24 in the printed circuit board 12 and are screwed into corresponding fastening holes 26 in the housing floor 14. The plug connectors 18, 20 pass through suitably dimensioned through openings 28 of the housing cover 16 towards the exterior.

The housing floor 14, which like the housing cover 16 is made of an aluminum alloy, has a shape that is contoured in such a way that a coherent, approximately rectangular, deepened housing internal section 30 is produced in the central area of the floor 14, said section being contiguous around its edge with a raised housing internal section 32.

Corresponding to this arrangement of deepened and raised housing internal sections 30, 32, the printed circuit board 12 has a coherent central printed circuit board section 34 (first printed circuit board section) which in the assembled state is arranged at a certain distance from the housing floor and which is populated on both sides with electronic components, whereas the printed circuit board 12 has an outer printed circuit board section 36 (second printed circuit board section) which runs in an annularly continuous manner along the printed circuit board edge and whose underside is directly connected to the raised housing internal section 32 via a heat-conducting adhesive layer 42 (FIGS. 2 and 3).

This partial connection of the printed circuit board 12 via the adhesive layer 42 guarantees a reliable mechanical retention of the printed circuit board 12 and moreover acts as an efficient dissipation path for heat which is produced by the electrical components during the operation of the control device 10. The adhesive has a thermal conductivity of approximately 2 W/mK. Consequently, the control device 10 is suitable in particular for installation close to the engine in a motor vehicle, since the described structure can cope well with the harsh environmental conditions in terms of mechanical stresses (e.g. vibrations) and temperature.

The illustrated engine control device 10 involves the use of a number of active power semiconductor components, e.g. in a circuit area for DC/DC step-down conversion of an on-vehicle voltage for supplying a circuit part for digital signal processing, or in a circuit area for DC/DC step-up conversion for supplying a circuit part for controlling a fuel injector arrangement of the internal combustion engine. These electronic power components are generally arranged on the upper side of the outer printed circuit board section 36, since an efficient heat dissipation away from this section downwards through the adhesive layer 42 to the housing is possible.

The plug connectors 18, 20 which are used in the illustrated exemplary embodiment have terminal pins which run straight downwards and can be pressed into correspondingly dimensioned contact holes in the printed circuit board 12 ("press-fit" technology), thereby offering ease of manufacturing. The use of such non-bent terminal pins has a further advantage in that the plug connectors 18, 20 can be integrated in the housing cover 16 (either before or after the housing is closed), this being beneficial with regard to the base surface of the control device 10, and not integrated in a housing side wall area as often occurs in the case of conventional control devices and thereby unnecessarily increases the base surface of the housing. Finally, the contacting of the terminal pins in the central printed circuit board section 34 has the advantage that the conductor paths of the printed circuit board 12 which lead from electronic components to the terminal pins can be arranged comparatively simply in the sense of a less complicated circuit board layout. In particular, the course of the conductor paths between individual components and individual terminal pins tends to be shorter and more direct. By contrast, the printed circuit board layout is more costly and less compact in terms of the required printed circuit board surface when contacting is provided at the edge area of the printed circuit board, as is often the case in conventional control devices with angled plug-connector terminal pins. With regard to the heat dissipation properties of the described control device 10, the centrally-oriented arrangement of the plug connectors 18, 20 is moreover also advantageous in that the terminal pins, which dissipate rather than generate heat, are arranged in that printed circuit board section (34) which is less efficiently cooled than the outer printed circuit board section 36, and in that the terminal pins do not require any printed circuit board surface in the efficiently cooled outer printed circuit board section 36, this being preferably used for fitting with components that generate significant heat (e.g. power transistors).

When assembling the control device 10, a liquid adhesive (e.g. silicone-based) is applied to the raised housing internal section 32 and to the base of a groove 38 which runs around the housing floor 14. The already populated printed circuit board is then positioned in the housing floor 14 and placed on the adhesive layer. The plug connectors 18, 20 and their terminal pins are then contacted to the printed circuit board 12 using press-in technology and fastened by means of the fastening screws 22. In the illustrated exemplary embodiment, the screwing of the plug connectors 18, 20 acts as an additional (not necessary per se) fastening of the printed circuit board in the housing floor 14. Finally, the housing cover 16 is emplaced from above in such a way that an extending projection which runs around the edge of said cover engages in the groove 38 and is bonded thereto. Alternatively, the plug connectors 18, 20 can be attached to the upper side of the printed circuit board first. If a groove is provided around the plug connectors, the connection between the plug connectors 18, and the housing cover 16 can also be implemented advantageously by means of a groove-and-projection bond.

We claim:

1. An electronic unit, comprising:
a printed circuit board having a central region populated with electronic components on both sides thereof, and an edge region adjoining said central region;
a housing enclosing said printed circuit board, said housing having a housing floor and a housing cover connected to said housing floor, said housing floor formed with a first surface having an outer region, a continuous wall surrounding said outer region of said first surface, and a raised second surface being raised with respect to said first surface, said wall extending from said first surface to said raised second surface, said first surface extending in a first direction from said continuous wall, said raised second surface extending in a second direction from said continuous wall, said second direction being opposite the first direction;
said central region of said printed circuit board being disposed spaced apart from said housing and said edge region being connected to said raised second surface of said housing floor via a heat-conducting adhesive layer;
said housing cover having an edge formed with an annularly continuous projection engaging into a corresponding groove formed in said raised second surface of said housing floor, said projection and said groove together forming a groove-and-projection connection and being glued to one another.

2. The electronic unit according to claim 1 configured as a control device for a motor vehicle and populated with electronic components for controlling the motor vehicle.

3. The electronic unit according to claim 1, wherein a common adhesive is used for said glued groove-and-projection connection and for said adhesive layer connecting said printed circuit board and said housing.

4. The electronic unit according to claim 1, which comprises at least one plug connector integrated in said housing cover for electrically connecting said electronic unit.

5. The electronic unit according to claim 4, wherein said plug connector includes terminal pins running straight to said printed circuit board and forming direct contact with said printed circuit board.

6. The electronic unit according to claim 5, wherein said terminal pins contact said circuit board via press-in contacts.

7. The electronic unit according to claim 1, wherein said edge region is a printed circuit board section running along a large part of an edge of said printed circuit board.

8. The electronic unit according to claim 7, wherein said edge region is a printed circuit board section running in an annularly continuous manner along said edge of said printed circuit board.

9. The electronic unit according to claim 1, wherein said edge region has first side at least partly populated with the electronic components, and a second side connected with said heat-conducting adhesive layer.

10. The electronic unit according to claim 1, wherein the raised second surface of the housing floor dissipates heat away from the printed circuit board and serves as a main support for the printed circuit board.

11. A method for manufacturing an electronic unit, which comprises the following steps:
   a) providing a printed circuit board with at least one first printed circuit board section in a central area thereof, being populated on both sides with electronic components, and having at least one second printed circuit board section arranged at an edge of the printed circuit board and having one side not populated with electronic components;
   b) providing a contoured housing floor formed with a first surface having an outer region, a continuous wall surrounding the outer region of the first surface, and a raised second surface being raised with respect to the first surface, the wall extending from the first surface to the raised second surface, the raised second surface including an edge region having an annularly continuous groove formed therein, the first surface extending in a first direction from the continuous wall, the raised second surface extending in a second direction from the continuous wall, the second direction being opposite the first direction;
   c) depositing heat-conducting adhesive on the raised second surface;
   d) pressing on the printed circuit board in order to bond the printed circuit board on the raised second surface of the housing floor;
   e) providing a housing cover having a projection configured to mate in annularly continuous circumferential engagement with the groove of the raised second surface of the housing floor, pressing the housing cover onto the housing floor with adhesive disposed to create a glued groove-and-projection connection between housing floor and housing cover.

12. The method according to claim 11, which comprises depositing the adhesive on the base of the circumferential groove prior to the step of pressing the housing cover onto the housing floor.

13. The method according to claim 11, wherein a common adhesive is used in the steps c) and e).

14. The method according to claim 11, which further comprises performing steps c) and d) to enable the raised second surface of the housing floor to dissipate heat away from the printed circuit board and to serve as a main support for the printed circuit board.

* * * * *